(12) United States Patent
Ohsawa

(10) Patent No.: US 8,508,888 B2
(45) Date of Patent: Aug. 13, 2013

(54) SUSPENSION BOARD WITH CIRCUIT

(75) Inventor: Tetsuya Ohsawa, Osaka (JP)

(73) Assignee: Nitto Denko Corporation, Osaka (JP)

(*) Notice: Subject to any disclaimer, the term of this patent is extended or adjusted under 35 U.S.C. 154(b) by 0 days.

(21) Appl. No.: 13/553,107

(22) Filed: Jul. 19, 2012

(65) Prior Publication Data

US 2013/0021699 A1    Jan. 24, 2013

Related U.S. Application Data

(60) Provisional application No. 61/573,076, filed on Aug. 26, 2011.

(30) Foreign Application Priority Data

| Jul. 21, 2011 | (JP) | 2011-160163 |
| Aug. 22, 2011 | (JP) | 2011-180972 |

(51) Int. Cl.
*G11B 5/60* (2006.01)

(52) U.S. Cl.
USPC .................. 360/234.5; 360/245.9

(58) Field of Classification Search
USPC .................. 360/234.5, 245.8, 245.9
See application file for complete search history.

(56) References Cited

U.S. PATENT DOCUMENTS

| 6,195,227 B1* | 2/2001 | Fan et al. .................. 360/294.3 |
| 6,262,868 B1* | 7/2001 | Arya et al. ..................... 360/290 |
| 7,518,830 B1* | 4/2009 | Panchal et al. ............. 360/245.8 |
| 8,068,313 B2* | 11/2011 | Nishiyama et al. ......... 360/245.8 |
| 8,427,783 B2* | 4/2013 | Tsuchiya et al. ........... 360/234.5 |
| 2005/0105217 A1* | 5/2005 | Kwon et al. ............... 360/245.3 |
| 2010/0110590 A1 | 5/2010 | Ohsawa et al. |
| 2012/0087041 A1* | 4/2012 | Ohsawa .................... 360/234.5 |

FOREIGN PATENT DOCUMENTS

JP    2010-108576 A    5/2010

* cited by examiner

*Primary Examiner* — Angel Castro
(74) *Attorney, Agent, or Firm* — Jean C. Edwards, Esq.; Edwards Neils PLLC

(57) ABSTRACT

A suspension board with circuit includes an external slider on which a magnetic head is mounted and an external electronic element provided in its vicinity. The suspension board with circuit includes a metal supporting board, a first insulating layer laminated on a top surface thereof, a first conductive pattern including a first terminal and laminated on the top surface side of the first insulating layer, a second insulating layer laminated on a back surface of the metal supporting board, and a second conductive pattern including a second terminal and laminated on the back surface side of the second insulating layer. The suspension board with circuit is formed with a communication space extending therethrough in a top-back direction and respective end edges of the first insulating layer and the second insulating layer protrude into the communication space to positions inner than that of an end edge of the metal supporting board.

3 Claims, 13 Drawing Sheets

FIG.7
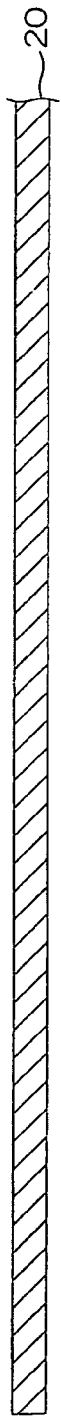
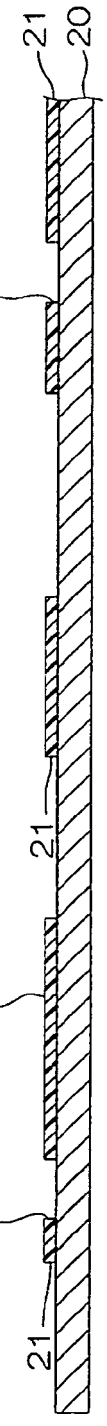
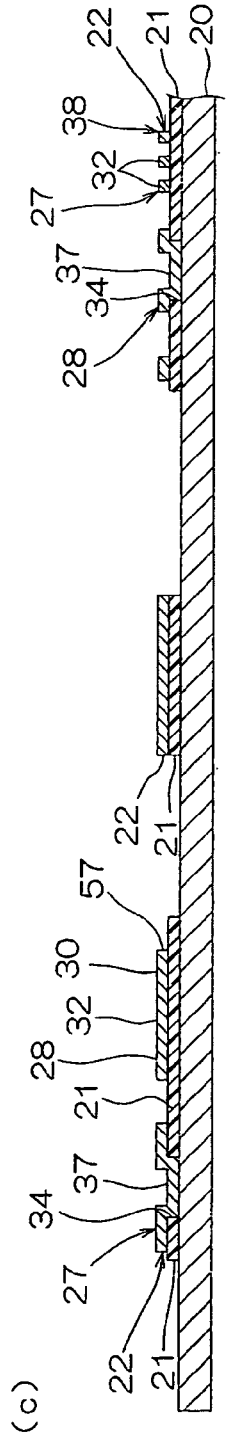
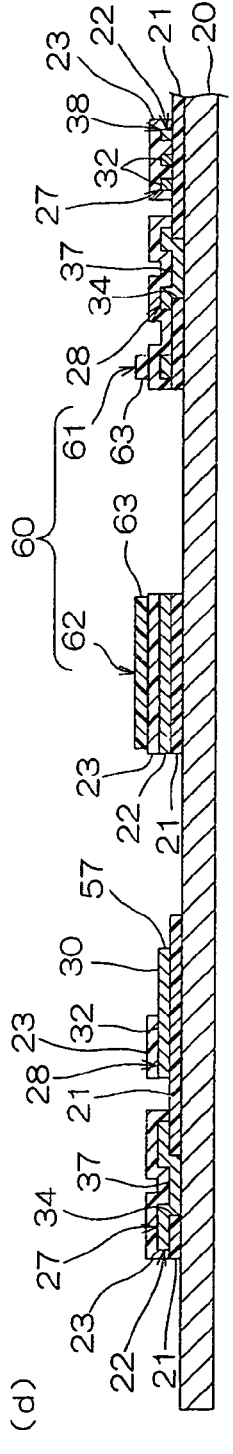
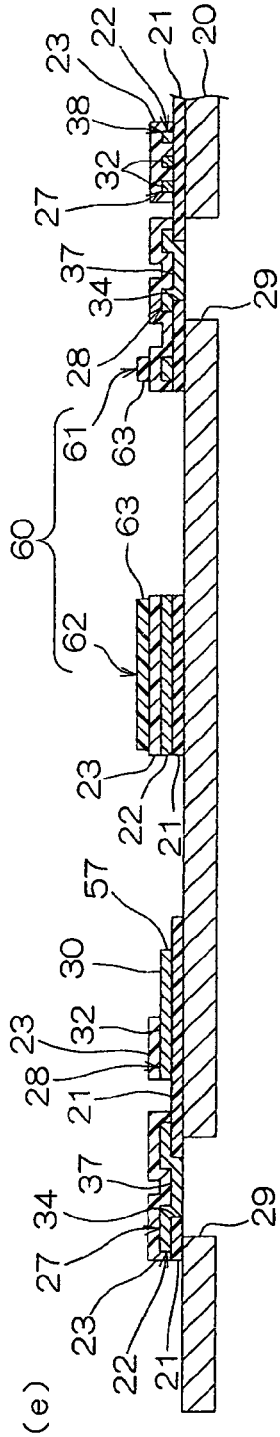

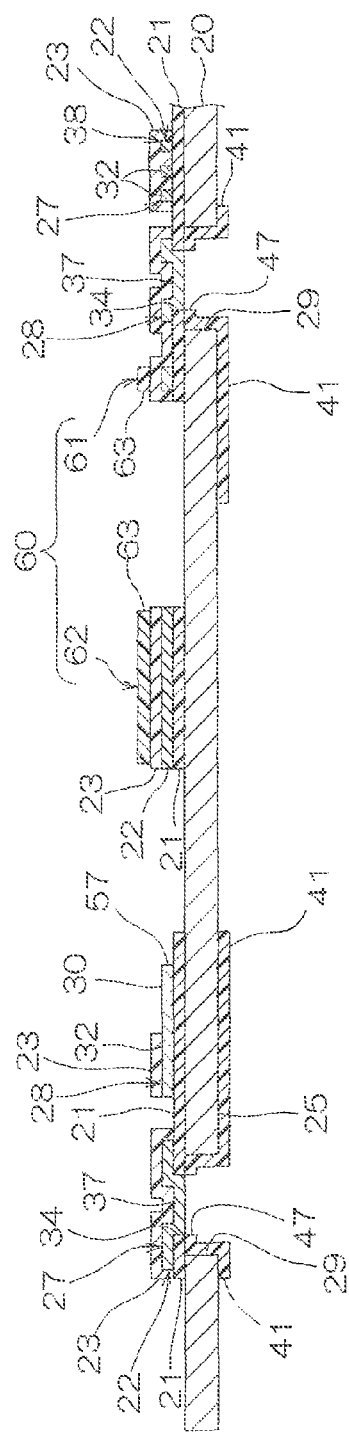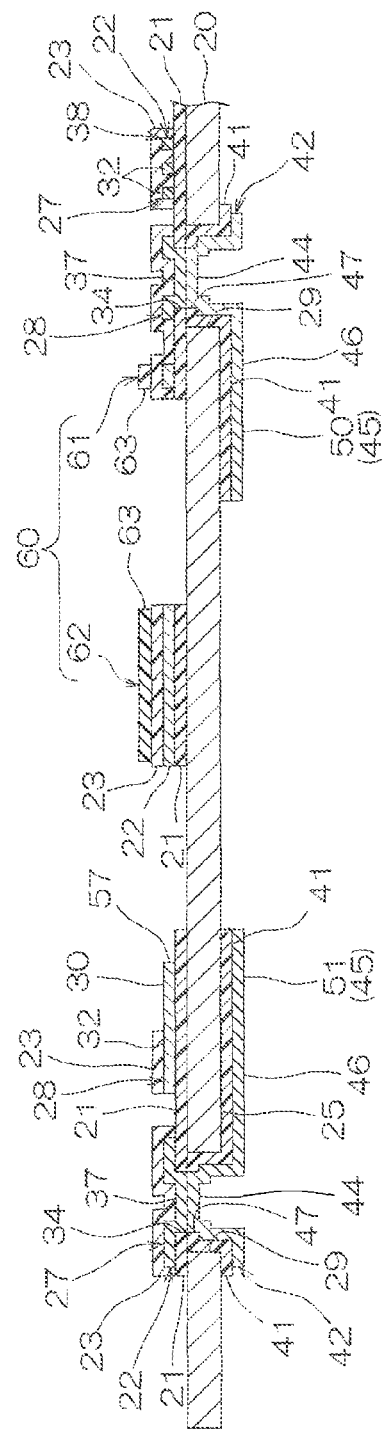
FIG.8
(f)
(g)

FIG.9
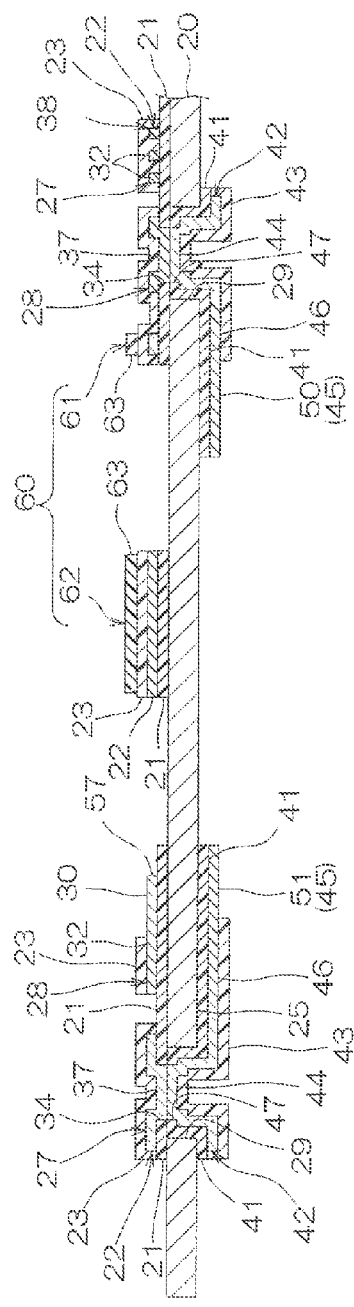
(h)
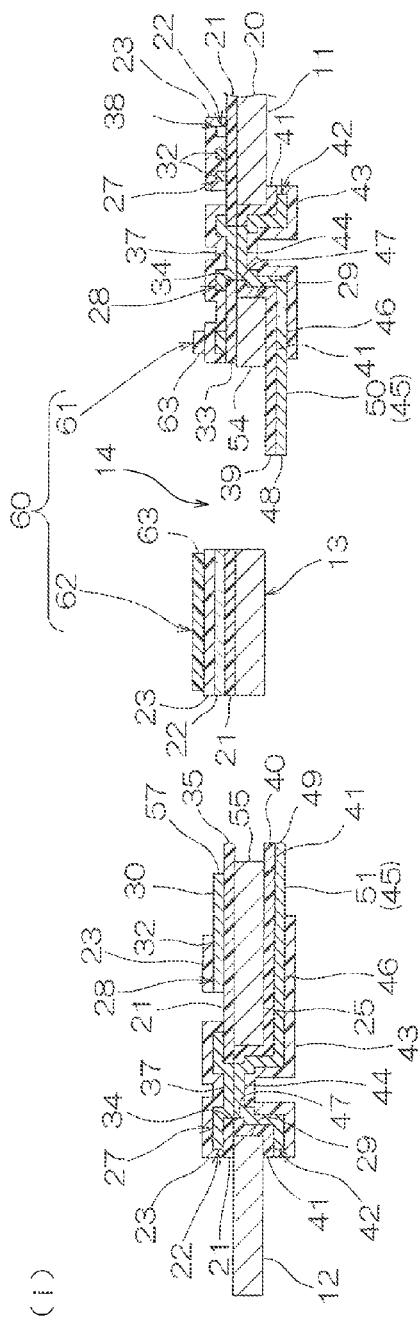
(i)

FIG.12
(a)
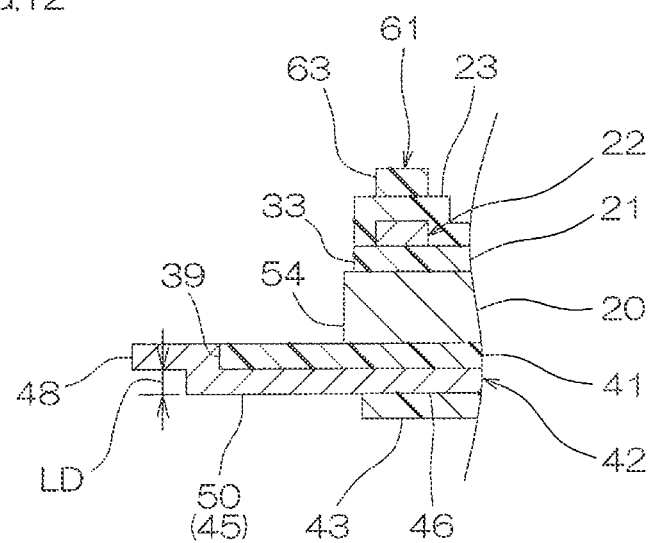
(b)
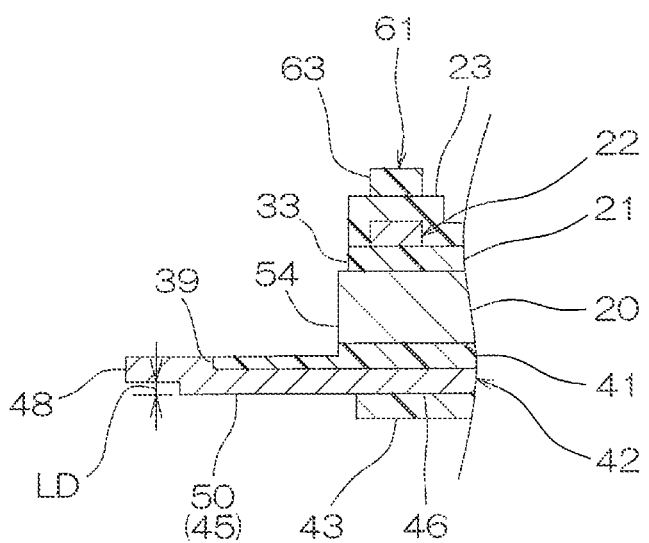

FIG.13
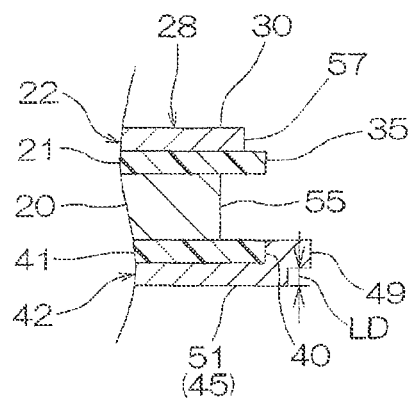
(a)
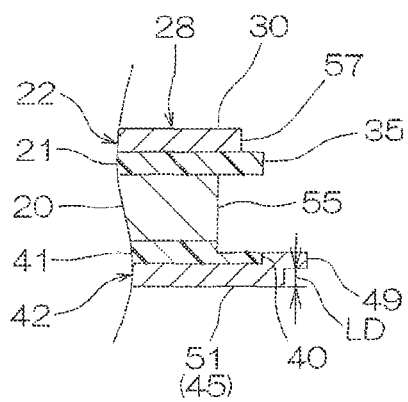
(b)
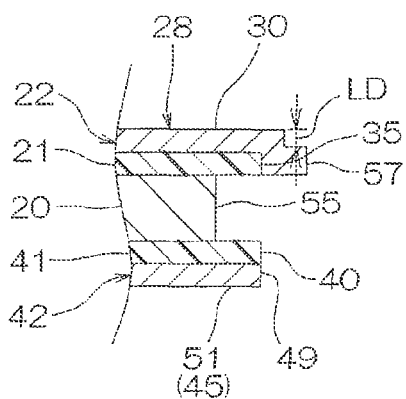
(c)
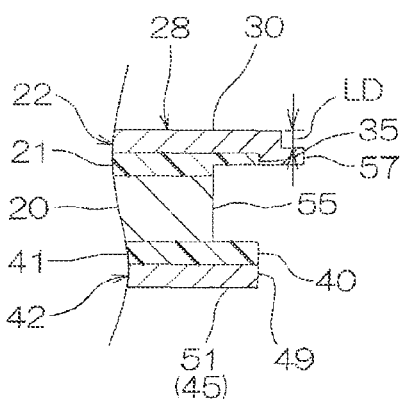
(d)
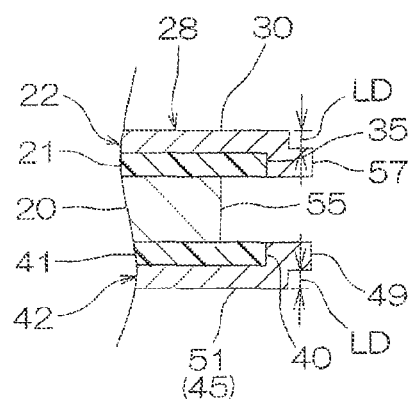
(e)
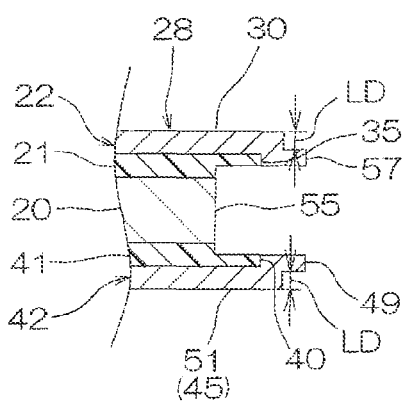
(f)

SUSPENSION BOARD WITH CIRCUIT

The present application claims the benefit of U.S. Provisional Application No. 61/573,076, filed on Aug. 26, 2011, and also claims priority from Japanese Application No. 2011-180972 filed on Aug. 22, 2011 and Japanese Application No. 2011-160163 filed on Jul. 21, 2011, the contents of which are herein incorporated by reference in their entirety.

BACKGROUND OF THE INVENTION

1. Field of the Invention

The present invention relates to a suspension board with circuit, and particularly to a suspension board with circuit used in a hard disk drive.

2. Description of the Related Art

A suspension board with circuit includes a metal supporting hoard, an insulating base layer formed thereon, and a conductive pattern formed thereon and having a head-side terminal portion for connecting to a magnetic head. In the suspension board with circuit, a magnetic head is mounted and connected to the head-side terminal portion to allow the suspension board with circuit to be used in a hard disk drive.

In recent years, it has been proposed to mount various electronic elements on such a suspension board with circuit. Specific examples of such electronic elements include a microactuator having a piezo-element (piezoelectric element) for precisely and finely adjusting the position and angle of a magnetic head, and a light emitting element for improving a recording density according to an optically assisted method.

For example, it has been known that, in a suspension board with circuit including a metal supporting board, a light emitting element, and a slider which are mounted on a surface of the metal supporting board, in order to adopt an optically assisted method, an element-side terminal portion electrically connected to the light emitting element and a head-side terminal portion electrically connected to a magnetic head mounted on the slider are formed on the same surface of the metal supporting board.

However, in such a configuration, both of the light emitting element and the slider are mounted on the same surface of the metal supporting board. Accordingly, the element-side terminal portion and the head-side terminal portion should be disposed at a high density so that it is difficult to compactize the suspension board with circuit.

In view of this, a suspension board with circuit has been proposed which includes a conductive pattern including, e.g., head-side terminals provided on the top surface of the suspension board with circuit and element-side terminals provided on the back surface of the suspension board with circuit and mounts thereon a slider on which a magnetic head electrically connected to the head-side terminals is mounted and a light emitting element electrically connected to the element-side terminals (see, e.g., Japanese Unexamined Patent No. 2010-108576).

The suspension board with circuit includes a metal supporting board, a first insulating base layer formed on the top surface of the metal supporting board, top-side power source wires formed on the top surface of the first insulating base layer, a second insulating base layer formed on the back surface of the metal supporting board, and back-side power source wires formed on the back surface of the second insulating base layer. The head-side terminals are continued to the top-side power source wires. The element-side terminals are continued to the back-side power source wires.

SUMMARY OF THE INVENTION

However, in a suspension board with circuit 101 proposed in Japanese Unexamined Patent No. 2010-108576 described above, as shown in FIG. 11, a mounting portion 103 for mounting thereon a slider 102 is formed with an insertion opening 105 through which a light emitting element 104 is inserted and, at the peripheral end edge of the insertion opening 105, the end edge of a metal supporting board 106 and the end edge of a second insulating base layer 107 are formed generally flush along a thickness direction. In addition, an element side terminal 108 is formed at an end portion of the second insulating base layer 107 so as to be proximate to the light emitting element 104 and connected to the light emitting element 104 via a wire 109.

Alternatively, it may be required to connect the element-side terminal 108 and the light emitting element 104 using a solder ball 110 (imaginary line) instead of the wire 109.

Note that the end edge of the metal supporting board 106 is located more proximate to the insertion opening 105 than the end edge of the first insulating base layer 111.

In that case, since the end edge of the metal supporting board 106 and the end edge of the second insulating base layer 107 are formed generally flush along the thickness direction, a molten solder may flow in the thickness direction to easily go past the second insulating base layer 107 and come in contact with the metal supporting board 106, resulting in a short circuit between the element-side terminal 108 and the metal supporting board 106 via the solder.

Moreover, since the end edge of the metal supporting board 106 is protruding into the insertion opening 105 to positions inner than that of the end edge of the first insulating base layer 111, the molten solder may flow toward the insertion opening 105 to easily go past the first insulating base layer 111 and come in contact with the metal supporting board 106, resulting in a short circuit between the head-side terminal 112 and the metal supporting board 106 via the solder.

It is therefore an object of the present invention to provide a suspension board with circuit which allows prevention of a short circuit between a second terminal and a metal supporting board and a short circuit between a first terminal and the metal supporting board.

To attain the above object, a suspension board with circuit of the present invention is a suspension board with circuit configured to be capable of mounting thereon an external slider on which a magnetic head is mounted and an external electronic element provided in a vicinity of the magnetic head, and including a metal supporting hoard, a first insulating layer laminated on a top surface of the metal supporting board, a first conductive pattern including a first terminal laminated on the top surface side of the first insulating layer, a second insulating layer laminated on a back surface of the metal supporting board, and a second conductive pattern including a second terminal laminated on the back surface side of the second insulating layer, wherein the suspension board with circuit is formed with a communication space extending therethrough in a top-back direction, the first terminal is configured such that the magnetic head of the slider is electrically connected thereto, the second terminal is configured such that the electronic element is electrically connected thereto, and at least one pair of the second terminals are provided with the communication space being interposed therebetween to allow the electronic element to extend therebetween, and, when projected in the top-back direction, respective end edges of the first insulating layer and the second insulating layer are protruding into the communication space to positions inner than that of an end edge of the metal supporting board.

It is preferable that the suspension board with circuit of the present invention is capable of mounting thereon the slider such that the slider overlaps the electronic element when projected in a the top-back direction.

In the suspension board with circuit of the present invention, it is preferable that the electronic element is a piezoelectric element.

In the suspension board with circuit of the present invention, when projected in the top-back direction, the end edges of the first insulating layer and the second insulating layer are protruding into the communication space to positions inner than that of the end edge of the metal supporting board.

That is, the end edge of the metal supporting board is relatively retracted from the end edges of the first insulating layer and the second insulating layer in a direction opposite to a direction in which the second insulating layer is protruding.

As a result, when the second terminal and the electronic element are connected using a solder, even if the molten solder flows toward the metal supporting board, it is possible to prevent the solder from coming in contact with the metal supporting board.

In addition, when the first terminal and the magnetic head mounted on the slider are connected using a solder, even if the molten solder flows toward the metal supporting board, it is possible to prevent the solder from coming in contact with the metal supporting board.

Therefore, it is possible to prevent a short circuit between the second terminal and the metal supporting board and a short circuit between the first terminal and the metal supporting board.

BRIEF DESCRIPTION OF THE DRAWINGS

FIG. 7 is a process view for illustrating a producing method of the suspension board with circuit,
  (a) showing the step of preparing a metal supporting board,
  (b) showing the step of forming a first insulating base layer,
  (c) showing the step of forming a first conductive pattern,
  (d) showing the step of forming a first insulating cover layer, and
  (e) showing the step of forming conduction openings in the metal supporting board;

FIG. 8 is a process view for illustrating the producing method of the suspension board with circuit, which is subsequent to FIG. 7,
  (f) showing the step of forming a second insulating base layer, and
  (g) showing the step of forming a second conductive pattern;

FIG. 9 is a process view for illustrating the producing method of the suspension board with circuit, which is subsequent to FIG. 8,
  (h) showing the step of forming a second insulating cover layer, and
  (i) showing the step of forming communication spaces;

FIG. 12 is an illustrative view illustrating variations of the suspension board with circuit of the present invention,
  (a) showing a cross-sectional view showing the first variation, and
  (b) showing a cross-sectional view showing the second variation; and FIG. 13 is an illustrative view illustrating, in conjunction with FIG. 12, the variations of the suspension board with circuit of the present invention,
  (a) showing a cross-sectional view showing the third variation,
  (b) showing a cross-sectional view showing the fourth variation,
  (c) showing a cross-sectional view showing the fifth variation,
  (d) showing a cross-sectional view showing the sixth variation,
  (e) showing a cross-sectional view showing the seventh variation, and
  (f) showing a cross-sectional view showing the eighth variation.

DETAILED DESCRIPTION OF THE INVENTION

Figure 1:
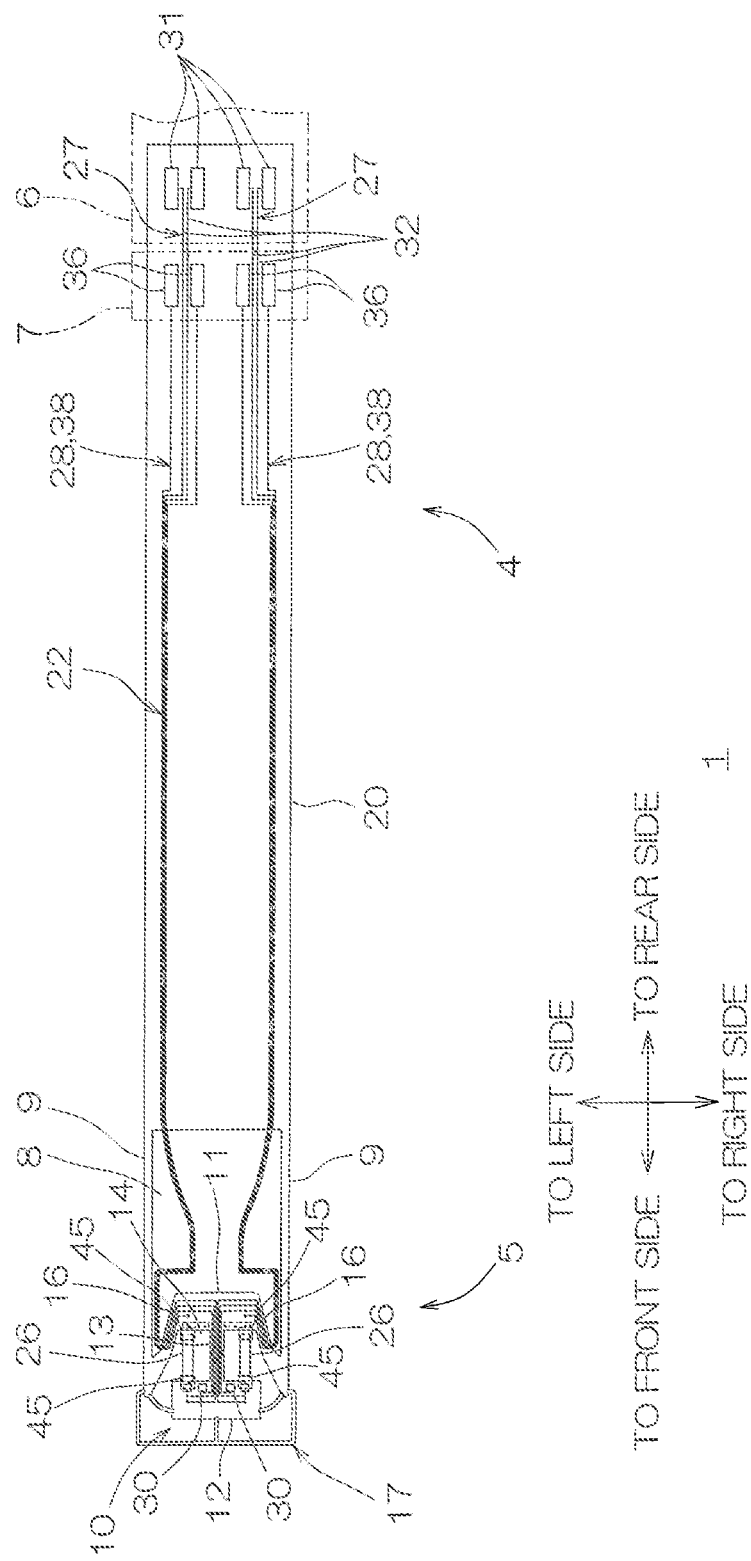
FIG. 1 shows a plan view of an embodiment of a suspension board with circuit of the present invention.
Figure 2:
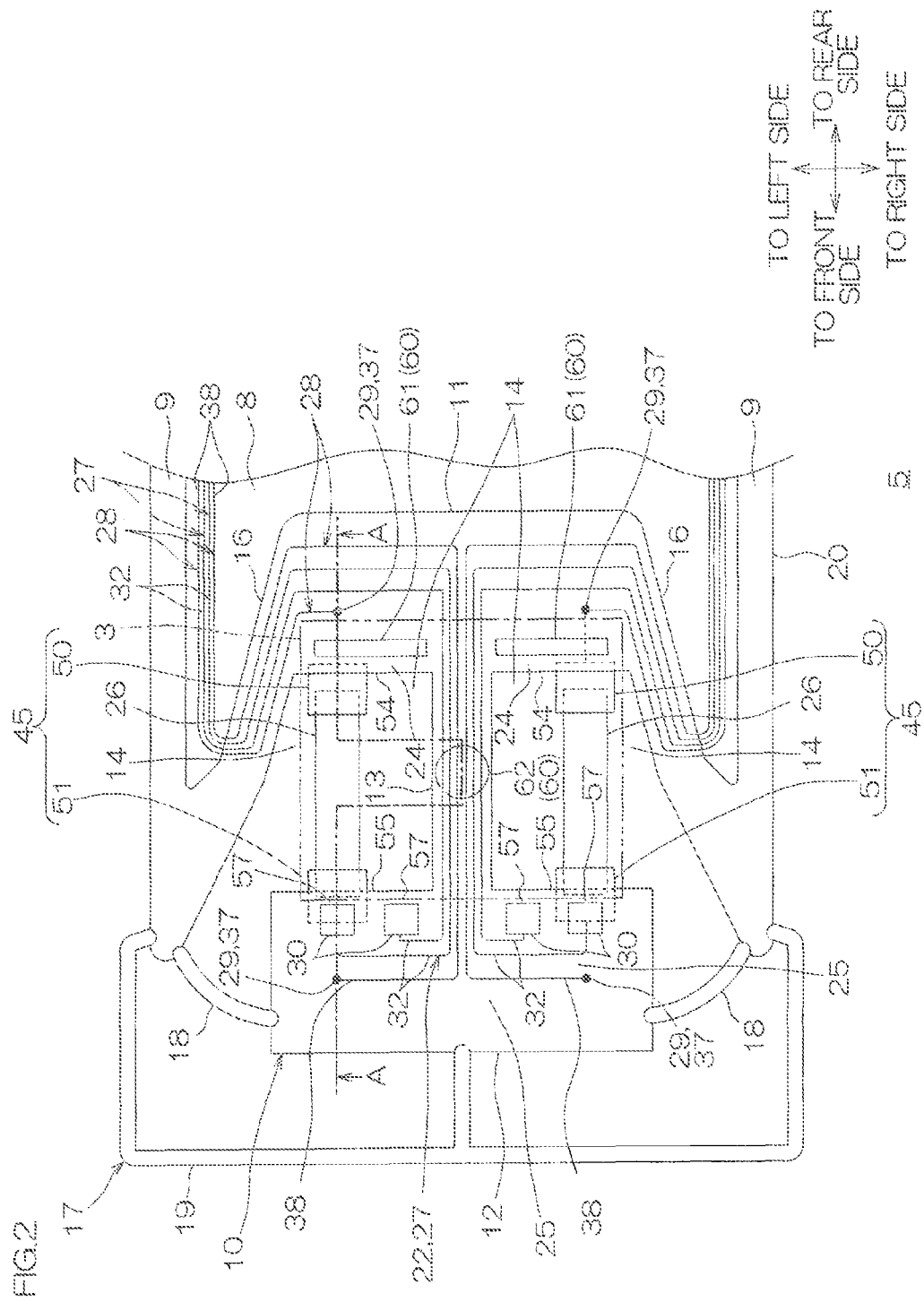
FIG. 2 shows a plan view of the gimbal portion of the suspension board with circuit shown in FIG. 1.
Figure 3:
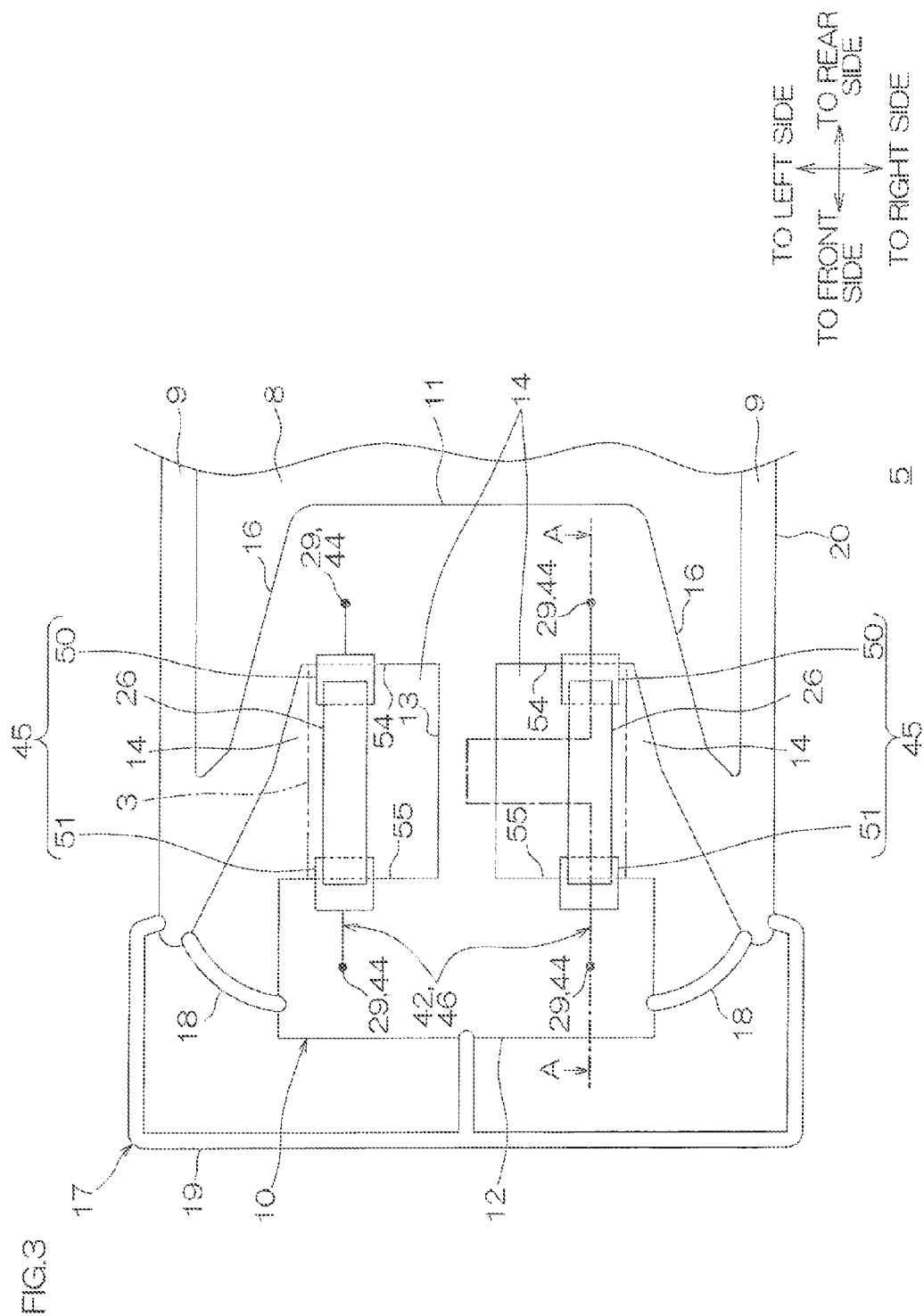
FIG. 3 shows a bottom view of the gimbal portion of the suspension board with circuit shown in FIG. 1.
Figure 4:
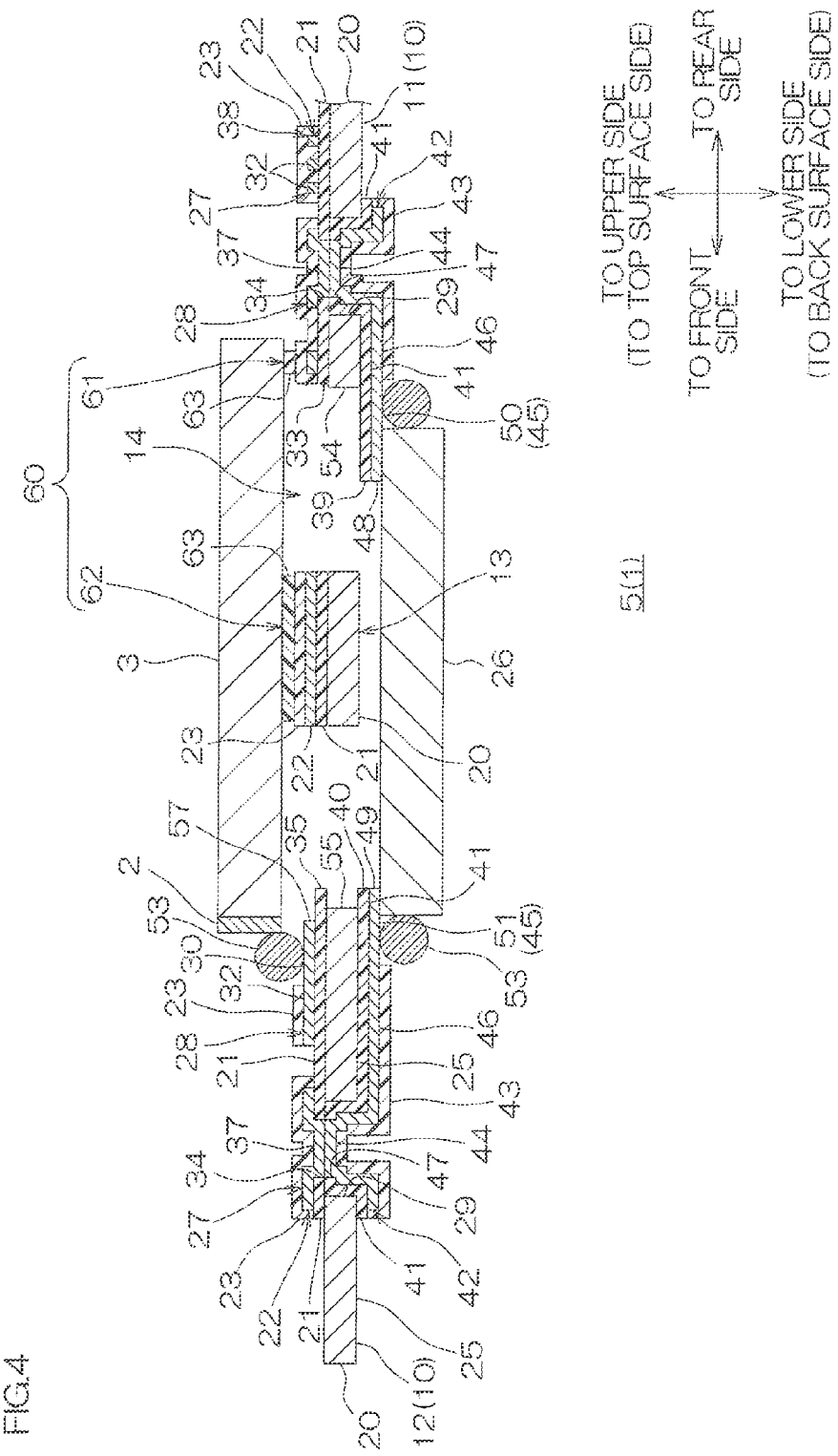
FIG. 4 shows a cross-sectional view of the gimbal portion shown in FIGS. 2 and 3 along the line A-A.
Figure 5:
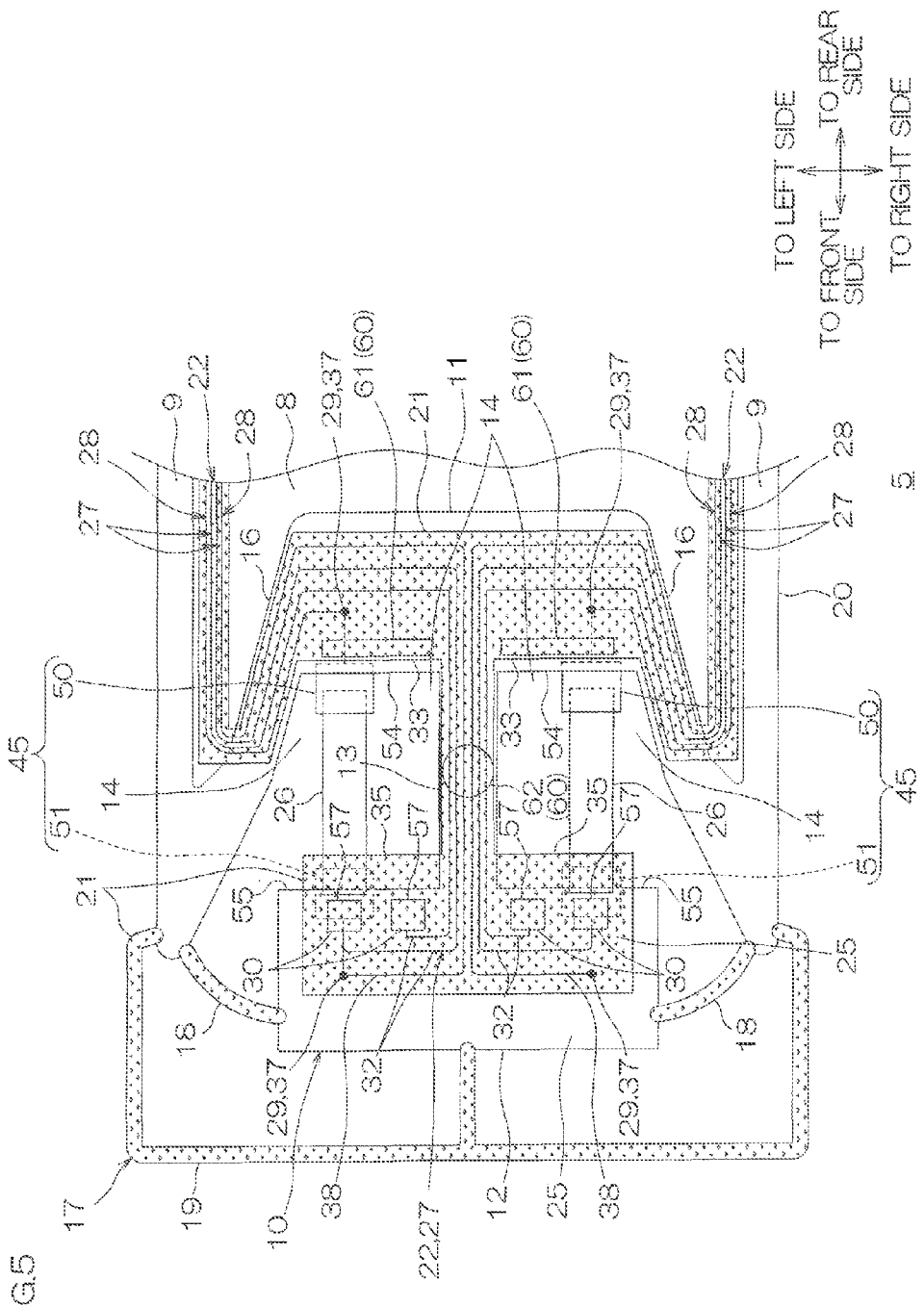
FIG. 5 shows a plan view of the gimbal portion shown in FIG. 2, which clearly shows a first insulating base layer.
Figure 6:
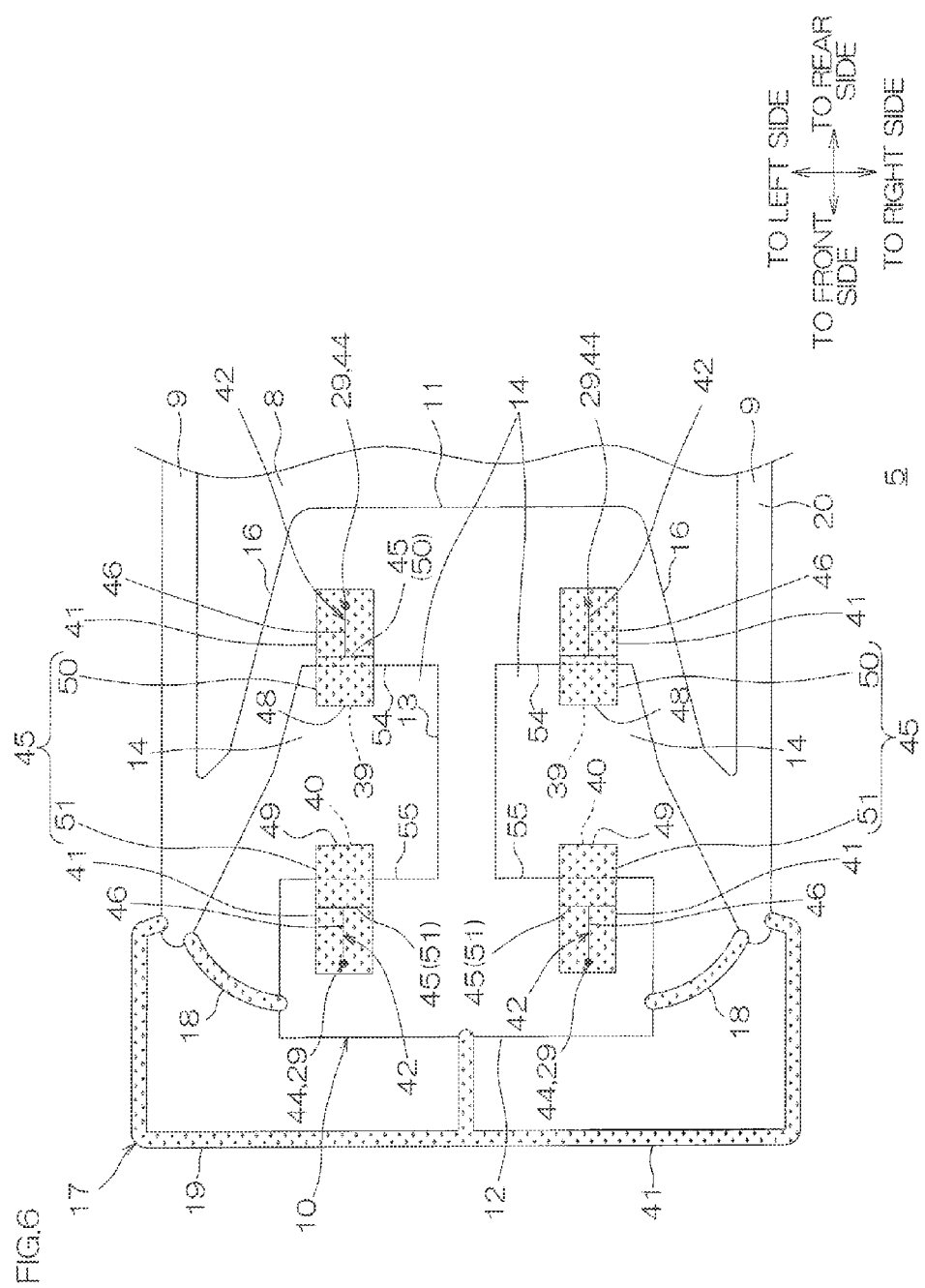
FIG. 6 shows a bottom view of the gimbal portion shown in FIG. 3, which clearly shows a second insulating base layer.
Figure 10:
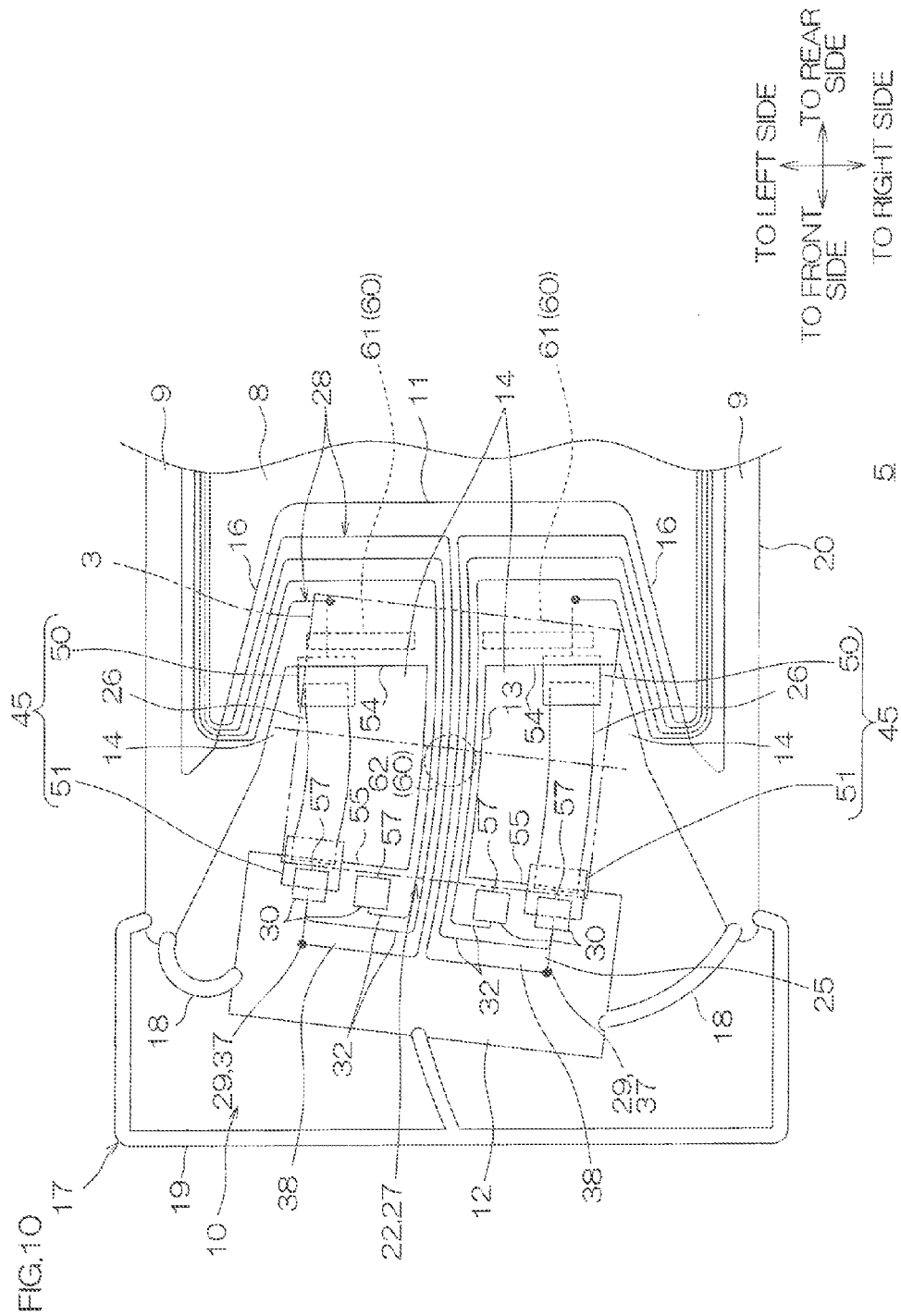
FIG. 10 shows a plan view of the stage of the gimbal portion shown in FIG. 2 that has been swung.
Figure 11:
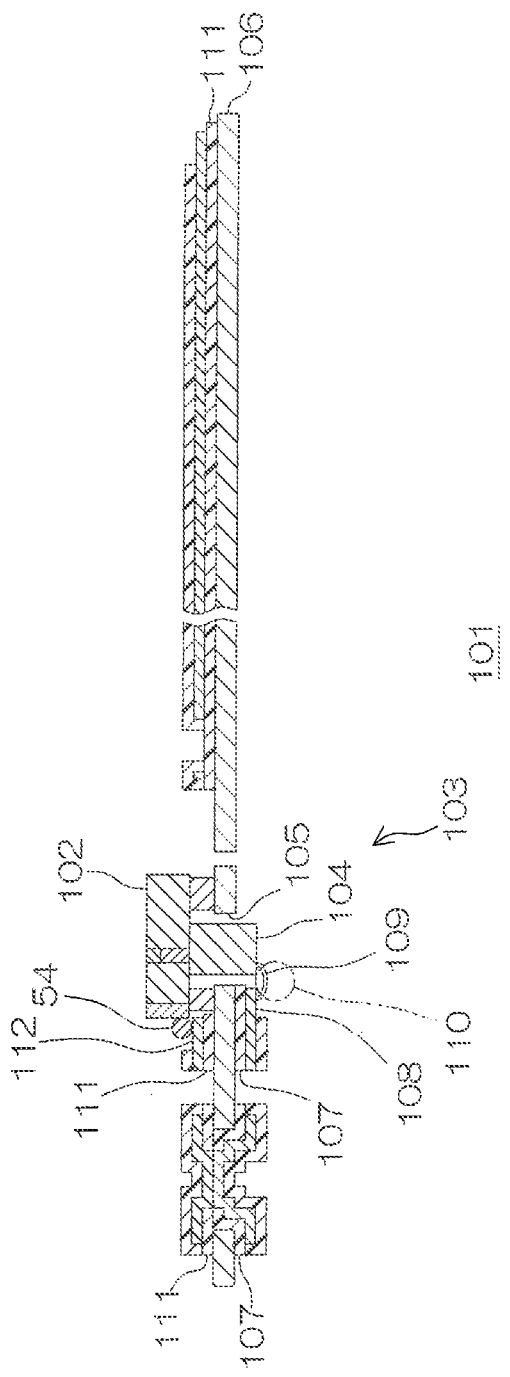
FIG. 11 shows a cross-sectional view of a conventional suspension board with circuit.

FIG. 1 shows a plan view of an embodiment of a suspension board with circuit of the present invention. FIG. 2 shows a plan view of the gimbal portion of the suspension board with circuit shown in FIG. 1. FIG. 3 shows a bottom view of the gimbal portion of the suspension board with circuit shown in FIG. 1. FIG. 4 shows a cross-sectional view of the gimbal portion shown in FIGS. 2 and 3 along the line A-A. FIG. 5 shows a plan view of the gimbal portion shown in FIG. 2, which clearly shows a first insulating base layer. FIG. 6 shows a bottom view of the gimbal portion shown in FIG. 3, which clearly shows a second insulating base layer. FIGS. 7 to 9 show process views for illustrating a producing method of the suspension board with circuit. FIG. 10 shows a plan view showing the stage of the gimbal portion shown in FIG. 2 that has been swung.

Note that in FIGS. 1, 2, and 10, a first insulating base layer 21 and a first insulating cover layer 23 each described later are omitted for clear illustration of relative positioning of a first conductive pattern 22 described later.

Also, in FIG. 3, second insulating base layers 41 and a second insulating cover layer 43 are omitted for clear illustration of relative positioning of a second conductive pattern 42 described later.

Also, in FIG. 5, the first insulating cover layer 23 is omitted for clear illustration of relative positioning of the first conductive pattern 22 and the first insulating base layer 21 each described later.

Also, in FIG. 3, the second insulating cover layer 43 described later is omitted for clear illustration of relative positioning of the second conductive pattern 42 and the second insulating base layers 41 each described later.

In FIGS. 1 and 4, the suspension board with circuit 1 is mounted in a hard disk drive (not shown) with a slider 3 for mounting thereon a magnetic head 2 and piezoelectric elements 26 each as an electronic element being mounted thereon.

As shown in FIG. 1, the suspension board with circuit 1 is formed in a flat belt shape extending in a longitudinal direction, and integrally includes a main body portion 4 disposed on one side in the longitudinal direction (hereinafter referred to as a rear side), and a gimbal portion 5 disposed on the other side of the main body portion 4 in the longitudinal direction (hereinafter referred to as a front side).

The main body portion 4 is formed in a generally rectangular plan view shape extending in the longitudinal direction. When the suspension board with circuit 1 is mounted in the hard disk drive, the main body portion 4 is electrically connected to an external circuit board 6 (imaginary line) such as a read/write board and to a power source 7 (imaginary line), while being supported by the load beam (not shown) of the hard disk drive.

The gimbal portion 5 is formed to extend from the front end of the main body portion 4 toward the front side. In the gimbal portion 5, a board opening 8 in a generally rectangular plan view shape is formed. The board opening 8 extends through the gimbal portion 5 in a thickness direction thereof (i.e., a top-back direction, which is hereinafter simply referred to as the thickness direction).

The gimbal portion 5 includes outrigger portions 9 defined outside the board opening 8 in a widthwise direction thereof (direction perpendicular to a front-rear direction), and a tongue portion 10 coupled to the outrigger portions 9.

The outrigger portions 9 are formed so as to linearly extend from the both widthwise end portions of the main body portion 4 toward the front side.

As shown in FIG. 2, the tongue portion 10 is provided widthwise inwardly of the outrigger portions 9, and coupled to the outrigger portions 9 via first coupling portions 16 extending widthwise inwardly and obliquely rearwardly from the front end portions of the outrigger portions 9.

The tongue portion 10 is formed in a generally H-shaped plan view shape which is open on both widthwise sides. That is, in the tongue portion 10, the both widthwise end portions of a middle portion in the front-rear direction are cut away (opened).

Specifically, the tongue portion 10 integrally includes a base portion 11 having a generally rectangular plan view shape extending long in the widthwise direction, a stage 12 disposed on the front side of the base portion 11 to be spaced apart therefrom and having a generally rectangular plan view shape extending long in the widthwise direction, and a middle portion 13 coupling the widthwise middle portion of the stage 12 to the base portion 11 and having a generally rectangular plan view shape extending long in the front-rear direction.

In the tongue portion 10, communication spaces 14 corresponding to the cut-away portions are defined.

The communication spaces 14 are defined on both widthwise sides of the middle portion 13. Each of the communication spaces 14 is formed so as to extend through the suspension board with circuit 1 in the thickness direction thereof.

In the middle portion in the front-rear direction of the stage 12, a wire turn-back portion 25 is defined.

The wire turn-back portion 24 is defined in a generally rectangular plan view shape which is long in the widthwise direction as a region where the first conductive pattern 22 described later is turned back.

The stage 12 is connected to the outrigger portions 9 by a second coupling portion 17.

The second coupling portion 17 includes curved portions 18 which curvedly couple the respective front ends of the outrigger portions 9 to the both widthwise ends of the stage 12, and an E-shaped portion 19 which couples the respective front ends of the outrigger portions 9 to the widthwise middle of the front end of the stage 12.

The curved portions 18 curvedly extend widthwise inwardly and obliquely frontwardly from the front ends of the outrigger portions 9 to reach the both widthwise ends of the stage 12.

The E-shape portion 19 has a generally E-shaped plan view shape. Specifically, the longitudinal portions of the E-shaped portions 19 extend from the front ends of the both outrigger portions 9 toward the front side to subsequently bend widthwise inwardly. After extending widthwise inwardly, the portions of the E-shaped portion 19 extending from the front ends of the both outrigger portions 9 are united and bent rearwardly to reach the widthwise middle of the front end of the stage 12.

The middle portion 13 is formed narrow and bendable in the widthwise direction.

The tongue portion 10 is provided with pedestals 60 for supporting the slider 3.

The pedestals 60 include first pedestals 61 provided on the base portion 11, and a second pedestal 62 provided on the middle portion 13.

The first pedestals 61 are disposed on the front-side portion of the base portion 11. Specifically, the first pedestals 61 are disposed so as not to overlap the first conductive pattern 22 described later when projected in the thickness direction. The plurality of (two) first pedestals 61 are provided to be widthwise spaced apart from each other. Each of the first pedestals 61 is formed in a generally rectangular plan view shape which is long in the widthwise direction.

The second pedestal 62 has a generally circular plan view shape, and provided on the front side of the first pedestals 61 to be spaced apart therefrom. Specifically, the second pedestal 62 is disposed on the middle portion in the front-rear direction of the middle portion 13. Note that the second pedestal 62 is disposed so as to overlap the first conductive pattern 22 in the middle portion 13 in the thickness direction.

As shown in FIG. 4, the suspension board with circuit 1 includes a metal supporting board 20, the first insulating layer 21 as a first insulating layer laminated on the top surface of the metal supporting board 20, the first conductive pattern 22 laminated on the top surface of the first insulating base layer 21, and the first insulating cover layer 23 laminated on the top surface of the first insulating base layer 21 so as to cover the first conductive pattern 22.

As shown in FIG. 1, the metal supporting board 20 extends in the longitudinal direction, and is formed in substantially the same outer shape as the outer shape of the suspension board with circuit 1 described above.

Also, as shown in FIG. 4, the metal supporting board 20 is formed with conduction openings 29.

As shown in FIG. 2, the plurality of (four) conduction openings 29 are provided in the base portion 11 and the stage 12 to be spaced apart from each other. Specifically, the conduction openings 29 are respectively formed in the both widthwise end portions of the base portion 11 and the both widthwise end portions of the stage 12. Each of the conduction openings 29 is formed in a generally circular plan view shape extending through the metal supporting board 20 in the thickness direction.

As shown in FIGS. 4 and 5, the first insulating base layer 21 is formed to correspond to the portion where the first conductive pattern 22 is formed.

Specifically, the first insulating base layer 21 is formed over the entire surfaces of the main body portion 4 and the gimbal portion 5 so as to cover the front end portions of the communication spaces 14.

That is, the first insulating base layer 21 corresponding to the stage 12 has a rear end edge 35 thereof protruding to a position rearward of that of the front end edge of each of the communication spaces 14 when projected in the thickness direction.

Note that the first insulating base layer 21 corresponding to the base portion 11 has the front end edge 33 thereof located on the rear side of the rear end edge of each of the communication spaces 14 when projected in the thickness direction.

The first insulating base layer 21 also forms the second coupling portion 17.

As shown in FIG. 4, the first insulating base layer 21 also annularly covers the peripheral end edge of each of the conduction openings 29 of the metal supporting board 20. Therefore, in the first insulating base layer 21, a plurality of (four) first base through holes 34 corresponding to the respective conduction openings 29 are formed in generally circular plan view shapes having respective centers common to those of the conduction openings 29.

As shown in FIGS. 1 and 5, the first conductive pattern 22 includes a head-side pattern 27 electrically connected to the magnetic head 2 (FIG. 4), and an element-side pattern 28 electrically connected to the piezoelectric elements 26 (FIG. 4).

The head-side pattern 27 integrally includes head-side terminals 30 each as a first terminal, external terminals 31, and signal wires 32 for connecting the head-side terminals 30 and the external terminals 31.

As shown in FIGS. 2 and 5, the plurality of (four) head-side terminals 30 are disposed on the rear end portion of the both widthwise end portions of the stage 12. Specifically, the head-side terminals 30 are each in a generally rectangular plan view shape, disposed on the rear side of the wire turn-back portion 25, and arranged to be aligned in widthwise mutually spaced-apart relation. The head-side terminals 30 are disposed on both sides of the middle portion 13 to be spaced apart from each other when projected in the front-rear direction.

As shown in FIGS. 4 and 5, a rear end edge 57 of each of the head-side terminals 30 is disposed to be retracted toward the front side from the rear end edge 35 of the first insulating base layer 21 of the stage 12.

As shown in FIG. 1, the plurality of (four) external terminals 31 are provided on the rear end portion of the main body portion 4, and arranged to be aligned in widthwise mutually spaced-apart relation so as to correspond to the head-side terminals 30. To the external terminals 31, an external circuit board 6 indicated by the imaginary line is connected.

The plurality of (four) signal wires 32 are formed to be spaced apart from each other and connect the corresponding head-side terminals 30 and the external terminals 31.

Specifically, the rear ends of the signal wires 32 are continued to the external terminals 31. More specifically, over the rear end portion of the main body portion 4, the signal wires 32 extend from the external terminals 31 toward the front side, and bend at middle points in the front-rear direction of the main body portion 4 into two separate branches extending outwardly in both widthwise directions. Then, the signal wires 32 bend at both widthwise end portions midway in the front-rear direction of the main body portion 4 toward the front side to extend along the widthwise outer end edges toward the front end portion of the main body portion 4. After passing through the board openings 8 in the gimbal portion 5 as shown in FIGS. 2 and 5, the signal wires 32 reach the first coupling portions 16.

Then, the signal wires 32 extend widthwise inwardly and obliquely rearwardly along the first coupling portions 16 to reach the both widthwise end portions of the base portion 11, and then bend widthwise inwardly to be united at the widthwise middle of the base portion 11. Thereafter, the signal wires 32 extend toward the front side along the middle portion 13, bend at the wire turn-back portion 25 of the stage 12 into two separate branches extending outwardly in both widthwise directions, and then extend outwardly in both widthwise directions along the rear end edge of the stage 12 to be subsequently turned back toward the rear side and connected to the front end portions of the head-side terminals 30.

Note that, over the base portion 11, the signal wires 32 are disposed on the rear side of the first pedestals 61 to be spaced apart therefrom.

As shown in FIGS. 1, 2, and 4, the element-side pattern 28 integrally includes supply-side terminals 36, top-side conductive portions 37, and top-side power source wires 38 for connecting the supply-side terminals 36 and the top-side conductive portions 37.

As shown in FIG. 1, on the rear end portion of the main body portion 4, the plurality of (four) supply-side terminals 36 are provided on the front side of the head-side terminals 30 to be spaced apart from each other. The supply-side terminals 36 are each in a generally rectangular plan view shape, and arranged to be aligned in widthwise spaced-apart relation. To the supply-side terminals 36, the power source 7 shown by the imaginary line is connected.

As shown in FIG. 4, the plurality of (four) top-side conductive portions 37 are formed so as to fill the individual first base through holes 34.

As shown in FIGS. 1 and 2, the plurality of (four) top-side power source wires 38 are formed in mutually spaced-apart relation so as to be connected to the top-side conductive portions 37 and the supply-side terminals 36. The top-side power source wires 38 are also disposed outside the signal wires 32 to be spaced apart therefrom over the main body portion 4 and the gimbal portion 5.

As shown in FIG. 4, the first insulating cover layer 23 is formed correspondingly to the portion in which the first conductive pattern 22 is formed.

Specifically, the first insulating cover layer 23 is formed in a pattern exposing the external terminals 31 (see FIG. 1) and the head-side terminals 30 and covering the signal wires 32, correspondingly to the head-side pattern 27. On the other hand, the first insulating cover layer 23 is formed in a pattern exposing the supply-side terminals 36 (see FIG. 1) and covering the top-side power source wires 38 and the top-side conductive portions 37, correspondingly to the element-side pattern 28.

The first insulating base layer 21, the first conductive pattern 22, and the first insulating cover layer 23 each described above form each of the pedestals 60 in conjunction with a top-side supporting layer 63 (described later).

That is, as shown in FIGS. 2 and 4, each of the pedestals 60 includes the first insulating base layer 21, the first conductive pattern 22, the first insulating cover layer 23, and the top-side supporting layer 63 which are successively laminated thereon.

In each of the pedestals 60, the first insulating cover layer 23 is formed so as to cover the first conductive pattern 22. Also, in each of the pedestals 60, the top-side supporting layer 63 is formed smaller than the first insulating cover layer 23.

As shown in FIG. 4, the suspension board with circuit 1 includes the second insulating base layers 41 each as a second insulating layer laminated on the back surface of the metal supporting board 20, the second conductive pattern 42 laminated on the back surfaces of the second insulating base layers 41, and the second insulating cover layer 43 laminated on the back surfaces of the second insulating base layers 41 so as to cover the second conductive pattern 42.

As shown in FIGS. 4 and 6, the second insulating base layers 41 are formed correspondingly to portions where the second conductive pattern 42, which is subsequently described in detail, is formed.

Specifically, the second insulating base layers 41 are formed so as to protrude from the base portion 11 of the gimbal portion 5 and the stage 12 into the communication spaces 14. More specifically, the flour second insulating base layers 41 are provided correspondingly to the four conduction openings 29. The second insulating base layers 41 are independently arranged to be spaced apart from each other in the front-rear direction and in the widthwise direction, and specifically disposed on the both widthwise end portions of the base portion 11 and the stage 12.

In bottom view, the second insulating base layers 41 are each formed in a generally rectangular shape extending long in the front-rear direction so as to include the individual conduction openings 29.

The second insulating base layers 41 corresponding to the base portion 11 are formed to extend between the both widthwise end portions of the base portion 11 and the rear end portions of the communication spaces 14.

In the gimbal portion 5, front end edges 39 of the second insulating base layers 41 corresponding to the base portion 11 protrudes to positions frontward of those of the rear end edges of the communication spaces 14 (i.e., toward the middle in the front-rear direction of each of the communication spaces 14) when projected in the thickness direction. That is, the second insulating base layers 41 corresponding to the base portion 11 are formed so as to traverse, in the front-rear direction, a front end edge 54 of the metal supporting board 20 along the widthwise direction when projected in the thickness direction.

The second insulating base layers 41 corresponding to the stage 12 are formed to extend between the both widthwise end portions of the stage 12 and the front end portions of the communication spaces 14. The second insulating base layers 41 corresponding to the stage 12 are each formed such that rear end edges 40 thereof overlap the rear end edge 35 of the first insulating base layer 21 when projected in the thickness direction.

That is, in the gimbal portion 5, the rear end edges 40 of the second insulating base layers 41 protrudes to positions rearward of those of the front end edges of the communication spaces 14 (i.e., toward the middle in the front-rear direction of each of the communication spaces 14) when projected in the thickness direction.

In other words, the second insulating base layers 41 corresponding to the stage 12 are formed so as to traverse, in the front-rear direction, a rear end edge 55 of the metal supporting board 20 along the widthwise direction.

Note that, in FIG. 4, the second insulating base layers 41 annularly cover the respective peripheral end edges of the conduction openings 29 of the metal supporting board 20 in the base portion 11 and the stage 12. As a result, in the second insulating base layers 41, a plurality of (four) second base through holes 47 corresponding to the individual conduction openings 29 are formed in generally circular plan view shapes having respective centers common to those of the conduction openings 29.

As shown in FIG. 6 note that the second insulating base layers 41 form the second coupling portion 17 in conjunction with the first insulating base layer 21 (FIG. 5).

In FIG. 3, the second conductive pattern 42 integrally includes back-side conductive portions 44, element-side terminals 45 each as a second terminal, and back-side power source wires 46 for connecting the back-side conductive portions 44 and the element-side terminals 45.

In FIG. 4, the plurality of (four) back-side conductive portions 44 are formed so as to fill the individual second base through holes 47.

As a result, the top-side conductive portions 37 and the back-side conductive portions 44 are in direct contact in the first base through holes 34 and the second base through holes 47 to be electrically connected to each other.

In FIG. 3, the element-side terminals 45 are disposed on the front end portions of the second insulating base layers 41 corresponding to the base portion 11 and on the rear end portion of the second insulating base layers 41 corresponding to the stage 12. The plurality of (four) element-side terminals 45 are provided to be spaced apart form each other in the widthwise direction and in the front-rear direction so as to face the communication spaces 14 and correspond to the individual back-side conductive portions 44. The element-side terminals 45 are each formed in a generally rectangular bottom shape such that the both widthwise end edges thereof are at the same positions as those of the second insulating base layers 41 (FIG. 6) when projected in the thickness direction.

The element-side terminals 45 include rear element-side terminals 50 provided in the rear end portions of the communication spaces 14, and front element-side terminals 51 provided on the front side of the rear element-side terminals 50 to be spaced apart therefrom.

On the base portion 11, the plurality of (two) rear element-side terminals 50 are arranged to be aligned in widthwise mutually spaced-apart relation.

The plurality of (two) front element-side terminals 51 are arranged to be aligned in widthwise mutually spaced-apart relation. As shown in FIG. 2 the front element-side terminals 51 are provided correspondingly to the widthwise outermost head-side terminals 30. Specifically, the front element-side terminals 51 are disposed so as to overlap the rear-side portions of the widthwise outermost head-side terminals 30 when projected in the thickness direction.

The rear element-side terminal 50 on one widthwise side and the front element-side terminal 51 on one widthwise side are provided to be paired up and spaced apart from each other with the communication space 14 on one widthwise side of the middle portion 13 being interposed therebetween. On the other hand, the rear element-side terminal 50 on the other widthwise side and the front element-side terminal 51 on the other widthwise side are provided to be paired up and spaced apart from each other with the communication space 14 on the other widthwise side of the middle portion 13 being interposed therebetween.

As shown in FIG. 4, front end edges 48 of the rear element-side terminals 50 are located to be generally flush with the front end edges 39 of the second insulating base layers 41 corresponding to the base portion 11 when projected in the thickness direction.

On the other hand, rear end edges 49 of the front element-side terminals 51 are located to be generally flush with the front end edges 40 of the second insulating base layers 41 corresponding to the stage 12 when projected in the thickness direction.

The rear end edges 49 of the front element-side terminals 51 are also located on the rear side of the rear end edges 57 of the rear-side terminals 30 to be proximate thereto with a minute gap interposed therebetween.

As shown in FIGS. 4 and 6, the plurality of (four) back-side power source wires 46 are formed to be spaced apart from each other so as to connect the corresponding back-side conductive portions 44 and the element-side terminals 45.

As shown in FIG. 4, the second insulating cover layer 43 is formed in the gimbal portion 5 so as to correspond to the second conductive pattern 42. Specifically, the second insulating cover layer 43 is formed so as to expose the element-side terminals 45 and cover the back-side power source wires 46 and the back-side conductive portions 44.

On the suspension board with circuit 1, as shown in FIGS. 2 and 4, the slider 3 (imaginary line in FIG. 2) and the piezoelectric elements 26 are mounted.

The slider 3 is mounted, together with the suspension board with circuit 1, on the front end of the load beam (not shown) of the hard disk drive (not shown). When the hard disk drive (not shown) is driven, the slider 3 floats over a magnetic disk (not shown) and travels relative thereto, while holding a minute gap therebetween.

The slider 3 has a generally rectangular plan view shape and a generally rectangular side cross-sectional shape. As shown by the imaginary line in FIG. 2, the slider 3 is disposed such that the front end portion thereof overlaps the rear end portion of the stage 12, and the rear end portion thereof overlaps the front end portion of the base portion 11 when projected in the thickness reaction. Specifically, the slider 3 is disposed such that the middle portion and rear end portion thereof include the pedestals 60 when projected in the thickness direction.

As also shown in FIG. 4, on the front end portion of the slider 3, the magnetic head 2 is mounted throughout the thickness direction of the slider 3. The magnetic head 2 is connected to the head-side terminals 30 in the front direction by solder balls 53.

As a result, the slider 3 is supported such that the front end portion thereof is fixed to the stage 12, and the rear end portion thereof is slidable relative to the base portion 11 in a planar direction (direction perpendicular to the thickness direction).

The rear end portion of the slider 3 includes the front element-side terminals 51 when projected in the thickness direction.

As shown in FIGS. 2 and 3, the piezoelectric elements 26 are extendable/contractable in the front-rear direction, and each formed in a generally rectangular plan view shape which is long in the front-rear direction. Also, as shown in FIG. 4, the piezoelectric elements 26 are disposed under the slider 3 to be spaced apart therefrom.

Specifically, as shown in FIGS. 2 and 3, the piezoelectric elements 26 are mounted so as to extend between the two pairs of element-side terminals 45 (front element-side terminals 51 and rear element-side terminals 50) between which the communication spaces 14 are interposed in the front-rear direction.

More specifically, as shown in FIG. 4, the terminals on the respective front end portions of the piezoelectric elements 26 are bonded to the back surfaces of the front element-side terminals 51 and electrically connected thereto via the solder balls 53. On the other hand, the terminals on the respective rear end portions of the piezoelectric elements 26 are bonded to the back surfaces of the rear element-side terminals 50 and electrically connected thereto via the solder balls 53.

In this manner, the piezoelectric elements 26 are fixed to both of the front element-side terminals 51 and the rear element-side terminals 50.

When projected in the thickness direction, the piezoelectric elements 26 overlap the slider 3. Specifically, when projected in the thickness direction, the piezoelectric elements 26 are entirely included in the slider 3.

The piezoelectric elements 26 are also disposed proximate to the magnetic head 2.

To each of the piezoelectric elements 26, electricity is supplied from the power source 7 (imaginary line of FIG. 1) via the element-side pattern 28 and the second conductive pattern 42, and the voltage thereof is controlled to thereby extend/contract the piezoelectric elements 26, Next, a producing method of the suspension board with circuit 1 is described with reference to FIGS. 7 through 9.

In the method, as shown in FIG. 7(*a*), the metal supporting board 20 is prepared first.

Examples of a material for forming the metal supporting board 20 include, e.g., stainless steel, a 42-alloy, aluminum, a copper-beryllium alloy, or phosphor bronze. Preferably, the metal supporting hoard 20 is formed of stainless steel.

The thickness of the metal supporting board 20 is in a range of, e.g., 15 to 50 μm, or preferably 15 to 30 μm.

Then, as shown in FIG. 7(*b*), a varnish of a photosensitive insulating material is coated on the top surface of the metal supporting hoard 20, dried, exposed to light, developed, and then cured by heating to form the first insulating base layer 21 in the foregoing pattern. At the same time, the first insulating base layer 21 corresponding to the pedestals 60 (see FIG. 7(*d*) is formed.

Examples of a material for forming the first insulating base layer 21 include an insulating material such as a synthetic resin such as a polyimide resin, a polyamideimide resin, an acrylic resin, a polyether nitrile resin, a polyether sulfone resin, a polyethylene terephthalate resin, a polyethylene naphthalate resin, or a polyvinyl chloride resin. Preferably, the first insulating base layer 21 is formed of a polyimide resin.

The thickness of the first insulating base layer 21 is in a range of, e.g., 1 to 35 μm, or preferably 3 to 1.5 μm.

The diameter of each of the first base through holes 34 is in a range of, e.g., 20 to 280 μm, or preferably 40 to 200 μm.

Then, as shown in FIG. 7(*c*), the first conductive pattern 22 is formed on the top surface of the first insulating base layer 21 by an additive method, a subtractive method, or the like. Simultaneously, the first conductive pattern 22 corresponding to the pedestals 60 (see FIG. 7(*d*)) is formed on the first insulating base layer 21.

Examples of a material for forming the first conductive pattern 22 include a conductive material such as, e.g., copper, nickel, gold, a solder, or an alloy thereof. Preferably, the first conducive pattern 22 is formed of copper.

The thickness of the first conductive pattern 22 is in a range of, e.g., 3 to 50 μm; or preferably 5 to 20 μm.

The width of each of the signal wires 32 and the top-side power source wires 38 is in a range of, e.g., 5 to 200 μm, or preferably 8 to 100 μm.

The spacing the widthwise direction, which holds true hereinafter) between the individual signal wires 32 is in a range of, 0.2 to 1000 μm, or preferably 8 to 100 μm. The spacing between each of the signal wires 32 and the top-side power source wire 38 closest thereto is in a range of, e.g., 5 to 1000 μm, or preferably 8 to 100 μm.

The width of each of the head-side terminals 30, the external terminals 31 (see FIG. 1), and the supply-side terminals 36 (see FIG. 1) is in a range of, e.g., 15 to 1000 μm, or preferably 20 to 800 μm.

The spacing between the individual head-side terminals 30 and the spacing between the individual external terminals 31 (see FIG. 1) are in a range of, e.g., 15 to 1000 μm, or preferably 20 to 800 μm.

Then, as shown in FIG. 7($d$), on the top surface of the first insulating base layer 21, a varnish of a photosensitive insulating material is coated so as to cover the first conductive pattern 22, dried, exposed to light, developed, and then cured by heating to form the first insulating cover layer 23 in the foregoing pattern. Simultaneously, the first insulating cover layer 23 corresponding to the pedestals 60 is formed on the first insulating base layer 21 so as to cover the first conductive pattern 22.

As a material for forming the first insulating cover layer 23, the same insulating material as the insulating material of the first insulating base layer 21 mentioned above can be used. The thickness of the first insulating cover layer 23 is in a range of, e.g., 1 to 40 μm, or preferably 1 to 10 μm.

Subsequently, as shown in FIG. 7($d$), over the first insulating cover layer 23 corresponding to the pedestals 60, the top-side supporting layer 63 is laminated. The top-side supporting layer 63 is formed by a known lamination method from, e.g., the insulating material or metal material mentioned above, or the like.

Then, as shown in FIG. 7($e$), in the metal supporting board 20, the conduction openings 29 are formed.

The conduction openings 29 are each formed by, e.g., an etching method such as, e.g., dry etching (e.g., plasma etching) or wet etching (e.g., chemical etching), drilling perforation, laser processing, or the like. Preferably, the conduction openings 29 are formed by an etching method.

In this manner, from the conduction openings 29 of the metal supporting board 20, the back surface of the first insulating base layer 21 and the back surfaces of the top-side conductive portions 37 are exposed.

The inner diameter of each of the conduction openings 29 is in a range of, e.g., 50 to 300 μm, or preferably 100 to 250 μm.

Then, as shown in FIG. 8($f$), on the back surface (including the back surface of the first insulating base layer 21 and the back surfaces of the top-side conductive portions 37 which are exposed from each of the conduction openings 29) of the metal supporting board 20, a varnish of a photosensitive insulating material is coated, dried, exposed to light, developed, and then cured by heating to form the second insulating base layers 41 in the foregoing pattern.

As a material for forming the second insulating base layers 41, the same insulating material as the insulating material of the first insulating base layer 21 mentioned above can be used.

The thicknesses of the second insulating base layers 41 are in a range of, e.g., 1 to 35 μm, or preferably 8 to 15 μm.

The diameter of each of the second base through holes 47 is in a range of, e.g., 20 to 280 μm, or preferably 40 to 200 μm.

Next, as shown in FIG. 8($g$), on the back surface of each of the second insulating base layers 41, the second conductive pattern 42 is formed by an additive method, a subtractive method, or the like.

As a material for forming the second conductive pattern 42, the same conductive material as the conductive material of the first conductive pattern 22 can be used.

The thickness of the second conductive pattern 42 is in a range of, e.g., 3 to 50 μm, preferably 5 to 20 μm.

The width of each of the back-side power source wires 46 is in a range of, e.g., 5 to 200 μm, or preferably 8 to 100 μm.

The width of each of the element-side terminals 45 is in a range of, e.g., 15 to 1000 μm, or preferably 20 to 800 μm.

Then, as shown in FIG. 9($h$), on the back surface of each of the second insulating base layers 41, a varnish of a photosensitive insulating material is coated so as to cover the second conductive pattern 42 on the back side, dried, exposed to light, developed, and cured by heating to form the second insulating cover layer 43 in the foregoing pattern.

As a material for forming the second insulating cover layer 43, the same insulating material as the insulating material of the first insulating base layer 21 mentioned above can be used. The thickness of the second insulating cover layer 43 is in a range of, e.g., 1 to 40 μm, or preferably 1 to 10 μm.

Then, as shown in FIG. 9($i$), the board openings 8 (see FIG. 1) and the communication spaces 14 are formed in the metal supporting board 20.

The communication spaces 14 and the board openings 8 are formed by wet etching such as, e.g., chemical etching.

At this time, to form the communication spaces 14, an etching time is set relatively long to over-etch the metal supporting board 20 and thereby frontwardly etch (over-etch) the portion of the metal supporting board 20 located between the first insulating base layer 21 and the second insulating base layers 41 and corresponding to the stage 12, while rearwardly etching (over-etching) the portion of the metal supporting board 20 located on the top side of each of the second insulating base layers 41 and corresponding to the base portion 11.

As a result, as shown in FIG. 4, the rear end edge 55 of the metal supporting board 20 in the stage 12 is located on the front side of the rear end edge 35 of the first insulating base layer 21 and the rear end edges 49 of the second insulating base layers 41, each corresponding to the stage 12.

That is, the rear end edge 35 of the first insulating base layer 21 and the rear end edges 49 of the second insulating base layers 41 protrude into the communication spaces 14 to positions inner than that of the rear end edge 55 of the metal supporting board 20.

On the other hand, the front end edges 39 of the second insulating base layers 41 corresponding to the base portion 11 protrudes into the communication space 14 to a position inner than those of the front end edge 54 of the metal supporting board 20 in the base portion 11.

Then, the metal supporting board 20 is trimmed to obtain the suspension board with circuit 1.

Thereafter, on the top surface side of the suspension board with circuit 1, the slider 3 provided with the magnetic head 2 is mounted on the upper surfaces of the pedestals 60. As a result, the slider 3 is supported on the pedestals 60 to be slidable in the planar direction.

Subsequently, on the top surfaces of the head-side terminals 30, the solder balls 53 are provided to come in contact with the terminals (side surface terminals) of the magnetic head 2.

Meanwhile, on the back surface side of the suspension board with circuit 1, the front end portions and rear end portions of the piezoelectric elements 26 are bonded to the front element-side terminals 51 and the rear element-side terminals 50. That is, on the top surfaces of the head-side terminals 30 and the back surfaces of the element-side terminals 45, the respective solder balls 53 are provided.

In this manner, each of the piezoelectric elements 26 is mounted on the suspension board with circuit 1 so as to extend between the pair of element-side terminals 45 (front element-side terminal 51 and rear element-side terminal 50).

Then, by melting each of the solder balls 53, the head-side terminals 30 are fixed to the magnetic head 32 to be electrically connected thereto.

At the same time, the element-side terminals 45 are fixed to the piezoelectric elements 26 to be electrically connected thereto.

Note that, as shown in FIG. 1, the external terminals 31 are electrically connected to the external circuit board 6, while the supply-side terminals 36 are electrically connected to the power source 7.

In this manner, the slider 3 and the piezoelectric elements 26 are mounted on the suspension board with circuit 1.

Next, the swing of the slider 3 resulting from the extension/contraction of the piezoelectric elements 26 is described with reference to FIG. 10.

First, electricity is supplied from the power source 7 (FIG. 1) to the piezoelectric elements 26 via the element-side terminals 45, and the voltage of the electricity is controlled to contract one of the piezoelectric elements 26. Consequently, the front element-side terminal 51 and the rear element-side terminal 50 which fix the one of the piezoelectric elements 26 move relatively closer to each other. That is, the one of the front element-side terminals 51 supported by the stage 12 moves rearwardly toward the one of the rear element-side terminals 50 supported by the base portion 11.

At the same time, electricity is supplied from the power source 7 (FIG. 1) via the element-side terminals 45, and the voltage of the electricity is controlled to extend the other piezoelectric element 26. Consequently the front element-side terminal 51 and the rear element-side terminal 50 which fix the other piezoelectric element 26 move relatively further away from each other. That is, the other front element-side terminal 51 supported by the stage 12 moves frontwardly away from the other rear element-side terminal 50 supported by the base portion 11.

As a result, the stage 12 swings outwardly in one widthwise direction around the rear end of the middle portion 13, while the front end of the middle portion 13 and a midway portion in the front-rear direction thereof are curved outwardly in one widthwise direction. At the same time, the front-side portion of the slider 3 swings outwardly in one widthwise direction.

On the other hand, if one of the piezoelectric elements 26 is extended and the other piezoelectric element 26 is contracted, the front-side portion of the slider 3 swings in a direction (in the other widthwise direction) opposite to the foregoing direction.

In the suspension board with circuit 1, when the gimbal portion 5 is projected in the thickness direction, the rear end edge 35 of the first insulating base layer 21 and the rear end edges 40 of the second insulating base layers 41 protrude into the communication spaces 14 to positions inner than that of the rear end edge 55 of the metal supporting board 20.

That is, the rear end edge 55 of the metal supporting board 20 is retracted from the rear end edge 35 of the first insulating base layer 21 and the rear end edges 40 of the second insulating base layers 41 toward the front side.

When the gimbal portion 5 is projected in the thickness direction, the front end edges 39 of the second insulating base layers 41 protrude into the communication space 14 to positions inner than that of the front end edge 54 of the metal supporting board 20.

That is, the front end edge 54 of the metal supporting board 20 is retracted from the front end edges 39 of the second insulating base layers 41 toward the rear side.

As a result, when the front element-side terminals 51 and the rear element-side terminals 50 and the piezoelectric elements 26 are connected with solder balls 53, even if a molten solder flows toward the metal supporting board 20, it is possible to prevent the solder from coming in contact with the metal supporting board 20.

In addition, when the head-side terminals 30 and the magnetic head 2 mounted on the slider 3 are connected using solder balls 53, even if the molten solder flows toward the metal supporting board 20, it is possible to prevent the solder from coming in contact with the metal supporting board 20.

Specifically, as shown in FIG. 4, even if the molten solder flows toward the metal supporting board 20 along the clearance between the lower surface of the front end portion of the slider 3 and each of the upper surfaces of the head-side terminals 30 and the upper surface of the portion of the first insulating base layer 21 located on the rear side of the head-side terminals 30, it is possible to prevent the solder from coming in contact with the metal supporting board 20.

Otherwise, when the clearance mentioned above is not formed, even if the molten solder over the upper surfaces of the head-side terminals 30 and the upper surface of the first insulating base layer 21 flows widthwise outwardly along the front end surface of the slider 3 (magnetic head 2), subsequently reaches the widthwise side end surfaces of the slider 3, and then flows toward the metal supporting board 20, it is possible to prevent the solder from coming in contact with the metal supporting board 20.

Therefore, it is possible to prevent a short-circuit between each of the element-side terminals 45 and the metal supporting board 20 and a short-circuit between each of the head-side terminals 30 and the metal supporting board 20.

Moreover, since the piezoelectric elements 26 overlap the slider 3, by bringing the base portion 11 and the stage 12 relatively further away from or closer to each other, the slider 3 can be accurately swung.

(Variations)

FIGS. 12 and 13 are illustrative views illustrating variations of the suspension board with circuit of the present invention. Note that, in FIGS. 12 and 13, the same members as used in the embodiment described above are designated by the same reference numerals, and a detailed description thereof is omitted.

In the embodiment described above, if the front end edges 39 of the second insulating base layers 41 laminated on the rear element-side terminals 50, the rear end edges 40 of the second insulating baser layers 41 laminated on the front element-side terminals 51, and the rear end edge 35 of the first insulating base layer 21 laminated on the head-side terminals 30 are formed to protrude into the communication spaces 14, the shapes of the rear element-side terminals 50, the front element-side terminals 51, the head-side terminals 30, the first insulating base layer 21, and the second insulating base layers 41 are not particularly limited.

For example, in the first variation, as shown in FIG. 12(a), each of the rear element-side terminals 50 can also be formed so as to protrude to a position frontward of those of the front end edges 39 of the second insulating base layers 41 laminated on the rear element-side terminals 50.

Specifically, each of the rear element-side terminals 50 is formed on the back surface of the second insulating base layer 41 to be upwardly bent at the rear end edge thereof, upwardly extend along the front end edge 39 of the second insulating base layer 41, be frontwardly bent at the upper end portion thereof, and extend toward the front side. Note that the upper surface of the protruding portion (portion located on the front side of the second insulating base layer 41) of the rear element-side terminal 50 is formed to be flush with the upper surface of the second insulating base layer 41 laminated on the rear element-side terminal 50.

There is a difference LD between the portion of each of the rear element-side terminals 50 formed on the back surface of the second insulating base layer 41 and the portion thereof located on the front side of the second insulating base layer 41, and the level difference LD can be adjusted as necessary.

To adjust the level difference LD, for example, in the step of forming the second insulating base layers 41 (see FIG. 8(*f*)), each of the second insulating base layers 41 is formed with a stepped portion corresponding to the protruding portion of the rear element-side terminal 50 by a method such as gradation exposure, then the metal supporting board 20 is etched (see FIG. 9(*i*)), and then the second insulating base layer 41 is etched so as to expose the upper surface of the protruding portion of the rear element-side terminal 50.

For example, in the second variation, as shown in FIG. 12(*b*), the level difference LD between the portion formed in the hack surface of the second insulating base layer 41 and the portion located on the front side of the second insulating base layer 41 is adjusted to a length corresponding to about half the level difference LD in the first variation.

It is also possible to form at least either one of the front element-side terminal 51 and the head-side terminal 30 such that the front element-side terminal 51 or the head-side terminal 30 protrudes into the communication space 14 to a position inner than that of the end edge of the second insulating base layer 41, in the same manner as in forming the rear element-side terminal 50 described above in the first variation.

In the case where at least either one of the front element-side terminal 51 and the head-side terminal 30 is formed to protrude to a position inner than that of the second insulating base layer 41, in the same manner as in the second variation described above, the level difference LD can also be adjusted as necessary.

Specifically, in the third variation, as shown in FIG. 13(*a*), each of the front element-side terminals 51 can be formed to protrude to a position rearward of that of the rear end edge 40 of the second insulating base layer 41 laminated on the front element-side terminal 51.

In the fourth variation, as shown in FIG. 13(*b*), the level difference LD between the portion of each of the front element-side terminals 51 formed on the back surface of the second insulating base layer 41 and the portion thereof located on the rear side of the second insulating base layer 41 is adjusted to a length corresponding to about half the level difference LD in the third variation.

In the fifth variation, as shown in FIG. 13(*c*), each of the head-side terminals 30 can be formed to protrude to a position rearward of that of the rear end edge 35 of the first insulating base layer 21 laminated on the head-side terminal 30.

In the sixth variation, as shown in FIG. 13(*d*), the level difference LD between the portion of each of the head-side terminals 30 formed on the top surface of the first insulating base layer 21 and the portion thereof located on the rear side of the first insulating base layer 21 is adjusted to a length corresponding to about half the level difference LD in the fifth variation.

In the seventh variation, as shown in FIG. 13(*e*), each of the front element-side terminals 51 can be formed to protrude to a position rearward of that of the rear end edge 40 of the second insulating base layer 41 laminated on the front clement-side terminal 51, while each of the head-side terminals 30 can be formed to protrude to a position rearward of that of the rear end edge 35 of the first insulating base layer 21 laminated on the head-side terminal 30.

In the eighth variation, as shown in FIG. 13(*f*), the level difference LD between the portion of each of the front element-side terminals 51 formed on the back surface of the second insulating base layer 41 and the portion thereof located on the rear side of the second insulating base layer 41 is adjusted to a length corresponding to about half the level difference LD in the seventh variation, while the level difference LD between the portion of each of the head-side terminals 30 formed on the top surface of the first insulating base layer 21 and the portion thereof located on the rear side of the first insulating base layer 21 is adjusted to a length corresponding to about half the level difference LD in the seventh variation.

Note that the variations described above can be combined with each other.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A suspension board with circuit configured to be capable of mounting thereon an external slider on which a magnetic head is mounted and an external electronic element provided in a vicinity of the magnetic head, comprising:
    a metal supporting board;
    a first insulating layer laminated on a top surface of the metal supporting board;
    a first conductive pattern including a first terminal laminated on the top surface side of the first insulating layer;
    a second insulating layer laminated on a back surface of the metal supporting board; and
    a second conductive pattern including a second terminal laminated on the back surface side of the second insulating layer, wherein
    the suspension board with circuit is formed with a communication space extending therethrough in a top-back direction,
    the first terminal is configured such that the magnetic head of the slider is electrically connected thereto,
    the second terminal is configured such that the electronic element is electrically connected thereto, and at least one pair of the second terminals are provided with the communication space being interposed therebetween to allow the electronic element to extend therebetween, and,
    when projected in the top-back direction, respective end edges of the first insulating layer and the second insulating layer are protruding into the communication space to positions inner than that of an end edge of the metal supporting board.

2. A suspension board with circuit according to claim 1, wherein the suspension board with circuit is capable of mounting thereon the slider such that the slider overlaps the electronic element when projected in the top-back direction.

3. A suspension board with circuit according to claim 1, wherein the electronic element is a piezoelectric element.

* * * * *